United States Patent
Yamazaki

(10) Patent No.: US 8,891,665 B2
(45) Date of Patent: Nov. 18, 2014

(54) TRANSMITTING APPARATUS AND COMMUNICATION SYSTEM

(75) Inventor: Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 408 days.

(21) Appl. No.: 12/961,842

(22) Filed: Dec. 7, 2010

(65) Prior Publication Data

US 2011/0158299 A1    Jun. 30, 2011

(30) Foreign Application Priority Data

Dec. 28, 2009    (JP) .................. 2009-297376

(51) Int. Cl.
*H04L 27/00*  (2006.01)
*H03M 9/00*  (2006.01)
*H04L 25/02*  (2006.01)

(52) U.S. Cl.
CPC ............. *H03M 9/00* (2013.01); *H04L 25/0272* (2013.01)
USPC .............. 375/295; 327/291; 332/106; 341/20

(58) Field of Classification Search
None
See application file for complete search history.

(56) References Cited

U.S. PATENT DOCUMENTS

| | | | | |
|---|---|---|---|---|
| 4,491,832 | A * | 1/1985 | Tanaka | 345/23 |
| 6,154,246 | A * | 11/2000 | Ogasawara et al. | 347/250 |
| 6,469,583 | B1 * | 10/2002 | Usui | 331/1 A |
| 7,176,928 | B1 * | 2/2007 | Sendrovitz | 345/534 |
| 2003/0043926 | A1 * | 3/2003 | Terashima et al. | 375/257 |
| 2005/0090215 | A1 * | 4/2005 | Cheng et al. | 455/180.3 |
| 2006/0133816 | A1 * | 6/2006 | Shin et al. | 398/154 |
| 2007/0024476 | A1 * | 2/2007 | Saeki et al. | 341/101 |

FOREIGN PATENT DOCUMENTS

| | | |
|---|---|---|
| JP | 2006-303915 A | 11/2006 |
| JP | 2007-265261 A | 10/2007 |
| JP | 2007-306545 A | 11/2007 |
| JP | 2009-212992 A | 9/2009 |

* cited by examiner

*Primary Examiner* — Shuwang Liu
*Assistant Examiner* — Gina McKie
(74) *Attorney, Agent, or Firm* — Canon USA, Inc., IP Division

(57) ABSTRACT

Parallel/serial conversion is performed on an N (where N is a natural number)-bit first parallel data signal with a first converted clock acquired by multiplying a reference clock by N, and parallel/serial conversion is performed on an (N×K)-bit (where K is a natural number) second parallel data signal with a second converted clock acquired by multiplying the reference clock by N×K.

24 Claims, 8 Drawing Sheets

TRANSMITTING APPARATUS AND COMMUNICATION SYSTEM

BACKGROUND OF THE INVENTION

1. Field of the Invention

The present invention relates to a transmitting apparatus, and it particularly relates to a transmitting apparatus which performs serial output.

2. Description of the Related Art

It is known that serial data communication is performed in order to reduce the number of signal lines in data communication between a plurality of electronic apparatuses (refer to Japanese Patent Laid-Open Nos. 2006-303915 and 2007-265261).

A transmitting-side apparatus disclosed in Japanese Patent Laid-Open No. 2006-303915 outputs a serial output synchronous clock acquired by multiplying a synchronous clock for data input by a phase locked loop (PLL) circuit. A parallel data signal input to a transmitting-side apparatus is converted to a serial data signal in synchronism with the serial output synchronous clock.

A receiving side apparatus converts the received serial data signal to a parallel data signal in synchronism with the serial output synchronous clock output from the transmitting-side apparatus.

The transmitting-side apparatus disclosed in Japanese Patent Laid-Open No. 2007-265261 converts a parallel data signal to a serial data signal in synchronism with the serial clock acquired by multiplying a reference clock. The transmitting-side apparatus outputs a transfer clock with an equal frequency to that of the reference clock.

A receiving side apparatus internally includes a PLL circuit and multiplies the received transfer clock to generate a serial clock and converts the serial data signal to a parallel data signal in synchronism with it.

In a transmitting-side apparatus of Japanese Patent Laid-Open No. 2006-303915, a serial output synchronous clock is output as a low voltage differential signal from an LVDS driver. On the other hand, a serial data signal is converted from a parallel data signal by a converting circuit which operates in synchronism with a serial output synchronous clock and is output as a low voltage differential signal from an LVDS driver. In other words, the serial data signal and the serial output synchronous clock have a difference in transition timing (skew) of the signals by the amount of delay due to the operation by the converting circuit. The skew varies in accordance with the operating condition such as the power supply voltage and temperature of the transmitting-side apparatus or the variation in apparatus characteristics due to a semiconductor process for producing the transmitting-side apparatus. Since a receiving side apparatus is required to accurately convert the serial data signal received from the transmitting-side apparatus to a parallel data even with the variations in delay time, the design of the apparatus may possibly be complicated.

Also in a transmitting-side apparatus disclosed in Japanese Patent Laid-Open No. 2007-265261, a transfer clock output from a PLL circuit is then output from a clock transmitting circuit. On the other hand, a serial data signal is converted from a parallel data signal by a converting circuit which operates in synchronism with a serial clock and is then output from a data transmitting circuit. Thus, Japanese Patent Laid-Open No. 2006-303915 may possibly have the same problem.

SUMMARY OF THE INVENTION

The present invention provides a communication apparatus which can achieve a highly accurate communication with a simple configuration and.

According to an aspect of the present invention, there is provided a transmitting apparatus including a clock generating unit which generates a first converted clock by multiplying a reference clock input thereto by N (where N is a natural number) and a second converted clock by multiplying the reference clock by N×K (where K is a natural number), a first parallel/serial converting unit which converts an N-bit first parallel data signal input thereto to a first serial data signal in synchronism with the first converted clock, and a second parallel/serial converting unit which converts an (N×K)-bit second parallel data signal input thereto to a second serial data signal in synchronism with the second converted clock, wherein the second serial data signal is a clock signal for converting the first serial data signal to parallel data signal.

According to another aspect of the present invention, there is provided a transmitting apparatus including a clock generating unit which generates a first converted clock by multiplying a reference clock input thereto by N×K (where N and K are natural numbers) and a second converted clock by multiplying the reference clock by N, a first parallel/serial converting unit which converts an (N×K)-bit first parallel data signal input thereto to a first serial data signal in synchronism with the first converted clock, and a second parallel/serial converting unit which converts an N-bit second parallel data signal input thereto to a second serial data signal in synchronism with the second converted clock, wherein the second serial data signal is a clock signal for converting the first serial data signal to parallel data signal.

The present invention allows implementation of communication in a simple configuration and with high accuracy.

Further features of the present invention will become apparent from the following description of exemplary embodiments with reference to the attached drawings.

DESCRIPTION OF THE EMBODIMENTS

First Embodiment

With reference to drawings, a first embodiment according to the present invention will be described.

Figure 1:
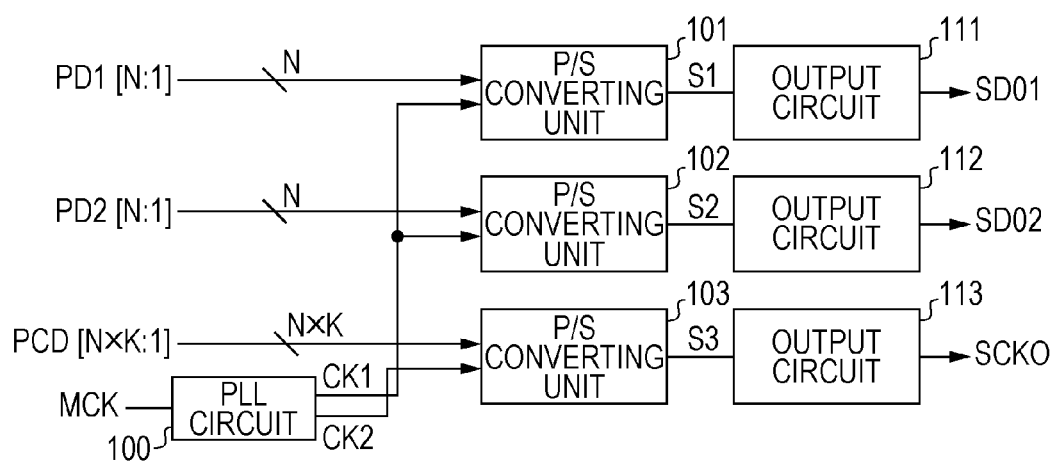
FIG. 1 is a block diagram illustrating a configuration example of a transmitting apparatus according to the present invention.

FIG. 1 is a block diagram illustrating a configuration example of a serial communication circuit applying the present invention.

A transmitting apparatus 1 includes a PLL circuit 100 which is a clock generating unit, parallel/serial converting units (P/S converting units) 101 to 103 and output units 111 to 113. The PLL circuit 100 generates a first converted clock CK1 acquired by multiplying a reference clock MCK by N and a second converted clock CK2 acquired by multiplying the reference clock MCK by N×K. The N and K are natural numbers. The P/S converting units 101 to 103 convert parallel data signals input in synchronism with the reference clock MCK to serial data signals, and the output units 111 to 113 may buffer, for example, and output the serial data signals output from the P/S converting units 101 to 103.

The P/S converting unit 101 which is a first parallel/serial converting unit receive an N-bit parallel data signal PD1 [N:1] which is a first parallel data signal and a first converted clock CK1 from the PLL circuit 100. The parallel data signal PD1 [N:1] is converted to an N-bit serial data S1 in synchronism with the first converted clock CK1 and may be buffered, for example, and output as a first serial data signal SDO1 by the output unit 111.

In the same manner, the P/S converting unit 102 which is another first parallel/serial converting unit receives an N-bit parallel data signal PD2 [N:1] which is another first parallel data signal and a first converted clock CK1 from the PLL circuit 100. The parallel data signal PD2 [N:1] is converted to an N-bit serial data S2 in synchronism with the first converted clock CK1 and may be buffered, for example, and output as a first serial data signal SDO2 by the output unit 112.

The P/S converting unit 103 which is a second parallel/serial converting unit receives an (N×K)-bit parallel clock data signal PCD [(N×K):1] which is a second parallel data signal and a second converted clock CK2 from the PLL circuit 100. The parallel clock data signal PCD [(N×K):1] is converted to an (N×K)-bit serial data S3 in synchronism with the second converted clock CK2 and may be buffered, for example, and output as a transfer clock SCKO which is a second serial data signal by the output unit 113. The transfer clock SCKO is a clock signal to be used for converting the first serial data signal to a parallel data signal, as will be described below.

Here, in order to keep changes even in characteristic against changes in power supply or temperature change, it is preferably designed such that the amounts of delay occurring in the P/S converting units 101 to 103 can be equal. More specifically, a signal of some bits may pass through an equal number of logic gates within the P/S converting units. The output circuits 111 to 113 preferably have the same circuit configuration as each other. A serial data signal and a transfer clock preferably have the same phase. However, for example, a phase difference equal to or lower than 1/10 of the data rate of a serial data signal is not a problem.

Figure 2:
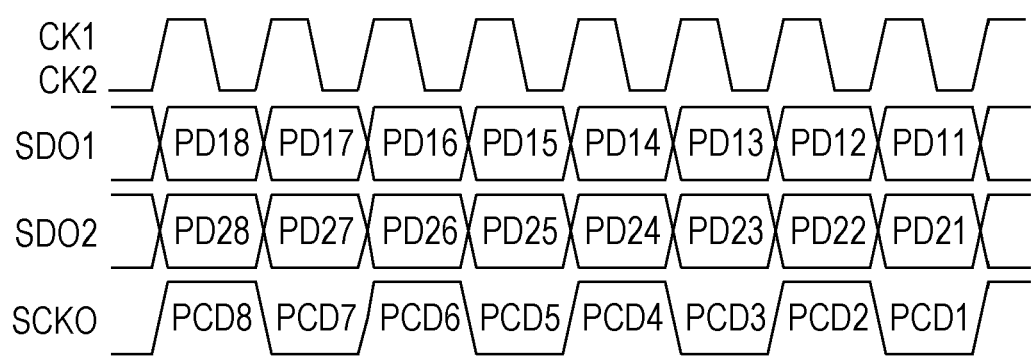
FIG. 2 is a timing chart according to a first embodiment.

Next, with reference to FIGS. 1 and 2, operations according to this embodiment will be described. FIG. 2 is a timing chart illustrating the relationship between the first and second converted clocks CK1 and CK2 and the serial data signals SDO1, SDO2 and SCKO where N=8 and K=1, that is, where the first converted clock CK1 and the second converted clock CK2 are equal.

In FIG. 2, the parallel clock data signal PCD [(N×K):1] input to the P/S converting unit 103 has [High(H), Low(L), H, L, H, L, H, L] from the higher bit side, and the P/S converting unit 103 outputs them from the higher bit side. Thus, the transfer clock SCKO has H and L which alternate with each other in synchronism with the second converted clock CK2. The serial data signals SDO1 and SDO2 are also output in synchronism with the first converted clock CK1.

In the configuration of the transmitting apparatus illustrated in FIG. 1, the P/S converting units 101 to 103 and output units 111 to 113 have the same configuration between data. Thus, the data can be influenced equally even when an operating condition such as the power supply voltage and temperature of the serial communication circuit 1 varies or the apparatus characteristics dependent on a semiconductor process vary. In other words, according to the present invention, the timing of transition of the serial data signal SDO1 and SDO2 and the timing of the transition of the transfer clock SCKO can maintain a relative relationship. Thus, variations in delay time which is problematic in the prior art can be reduced and can ideally be reduced to zero.

Figure 3:
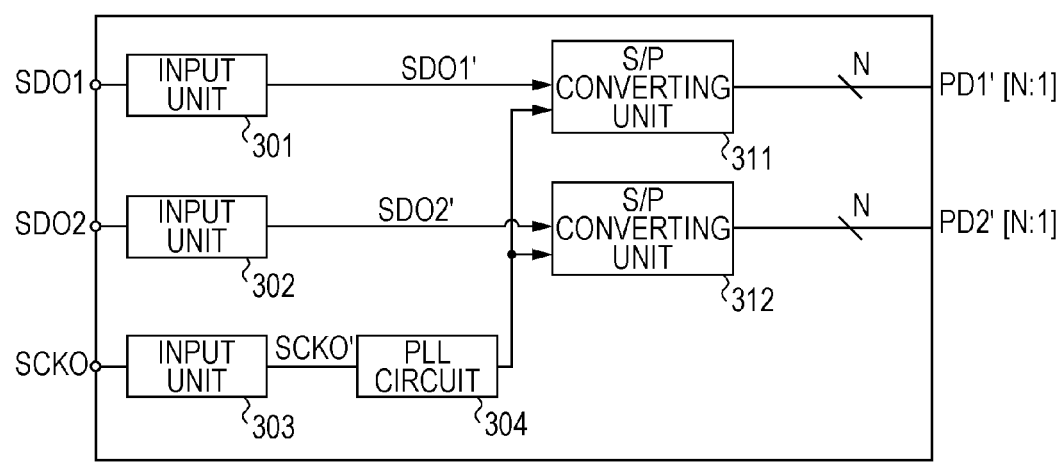
FIG. 3 is a block diagram illustrating a configuration example of a receiving side apparatus according to the present invention.

FIG. 3 illustrates a configuration example of a receiving side apparatus (also called a receiving apparatus hereinafter). A receiving side apparatus 3 includes input units 301 to 303 which output serial data signals SDO1 and SDO2 and a transfer clock SCKO input thereto, a PLL circuit 304, and serial/parallel converting unit (S/P converting units) 311 and 312.

The input units 301 to 303 may include a buffer, for example.

The PLL circuit 304 which is a second oscillating unit oscillates on the basis of a transfer clock SCKO' which is a serial data signal input from the input unit 303 and outputs a second intermediate clock. According to this embodiment, the second intermediate clock is acquired by multiplying the transfer clock SCKO' by N.

The S/P converting unit 311 receives a serial data signal SDO1' from the input unit 301 and a clock from the PLL circuit 304 and converts the serial data signal SDO1' to a parallel data signal PD1' [N:1] in synchronism with a clock from the PLL circuit 304.

The S/P converting unit 312 receives a serial data signal SDO2' from the input unit 302 and a clock from the PLL circuit 304 and converts the serial data signal SDO2' to a parallel data signal PD2' [N:1] in synchronism with a clock from the PLL circuit 304.

This configuration can reduce the skew between the serial data signals SDO1' and SDO2' and a clock output from the PLL circuit on the basis of the transfer clock SCKO' and allows easy timing design for reconstructing a serial data signal to a parallel data signal.

As described above, according to the first embodiment of the present invention, the skew in delay time in timing of signal transition between a transfer clock and a serial data signal can be reduced, and a highly accurate communication can be achieved with a simple configuration. Furthermore, the receiving side apparatus can be designed easily.

Second Embodiment

With reference to the drawings, a second embodiment according to the present invention will be described. The second embodiment is different from the first embodiment in the value of N and a sequence of a parallel clock data signal PCD [(N×K):1] for generating a transfer clock SCKO.

Figure 4:
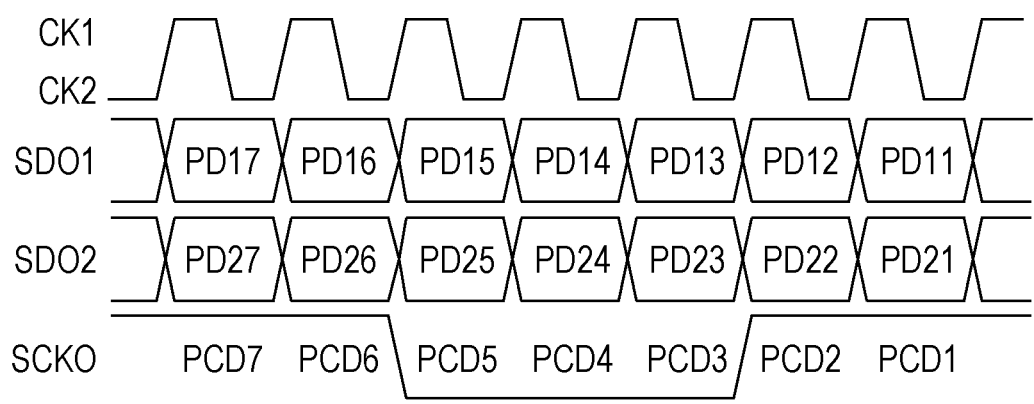
FIG. 4 is a timing chart according to a second embodiment.

FIG. 4 is a timing chart illustrating a relationship between first and second converted clocks CK1 and CK2 and serial data signals SDO1, SDO2 and SCKO where N=7 and K=1. The first converted clock CK1 is acquired by multiplying a reference clock MCK by 7, and the second converted clock CK2 is acquired by multiplying the reference clock MCK by 7×1=7. Also according to this embodiment, the first and second converted clocks CK1 and CK2 have the same phase, for example.

Referring to FIG. 4, a parallel clock data signal PCD [(N× K): 1] to be input to the P/S converting unit 103 is [H, H, L, L, L, H, H] from the higher bit side, and the P/S converting unit 103 outputs it from the higher bit side. The transfer clock SCKO here has an equal frequency to that of the reference clock MCK and has H periods and L periods with a ratio of 4:3.

As described above, the sequence of the parallel clock data signal PCD [(N×K):1] may be varied to adjust the frequency and/or duty ratio of the transfer clock SCKO. In other words, a parallel data setting unit, not shown, may be provided for setting the parallel clock data signal PCD [(N×K):1] variably so as to support various communication standards without changing its circuit configuration.

A receiving side apparatus may have the same configuration as that of the first embodiment.

As described above, according to the second embodiment of the present invention, the skew between a transfer clock and a serial data signal can be reduced, and a highly accurate communication can be achieved with a simple configuration and. The receiving side apparatus can be designed easily. The parallel clock data signal PCD [(N×K):1] may be set variably to support various communication standards.

Third Embodiment

With reference to FIGS. 5 to 8, a third embodiment of the present invention will be described.

Figure 5:
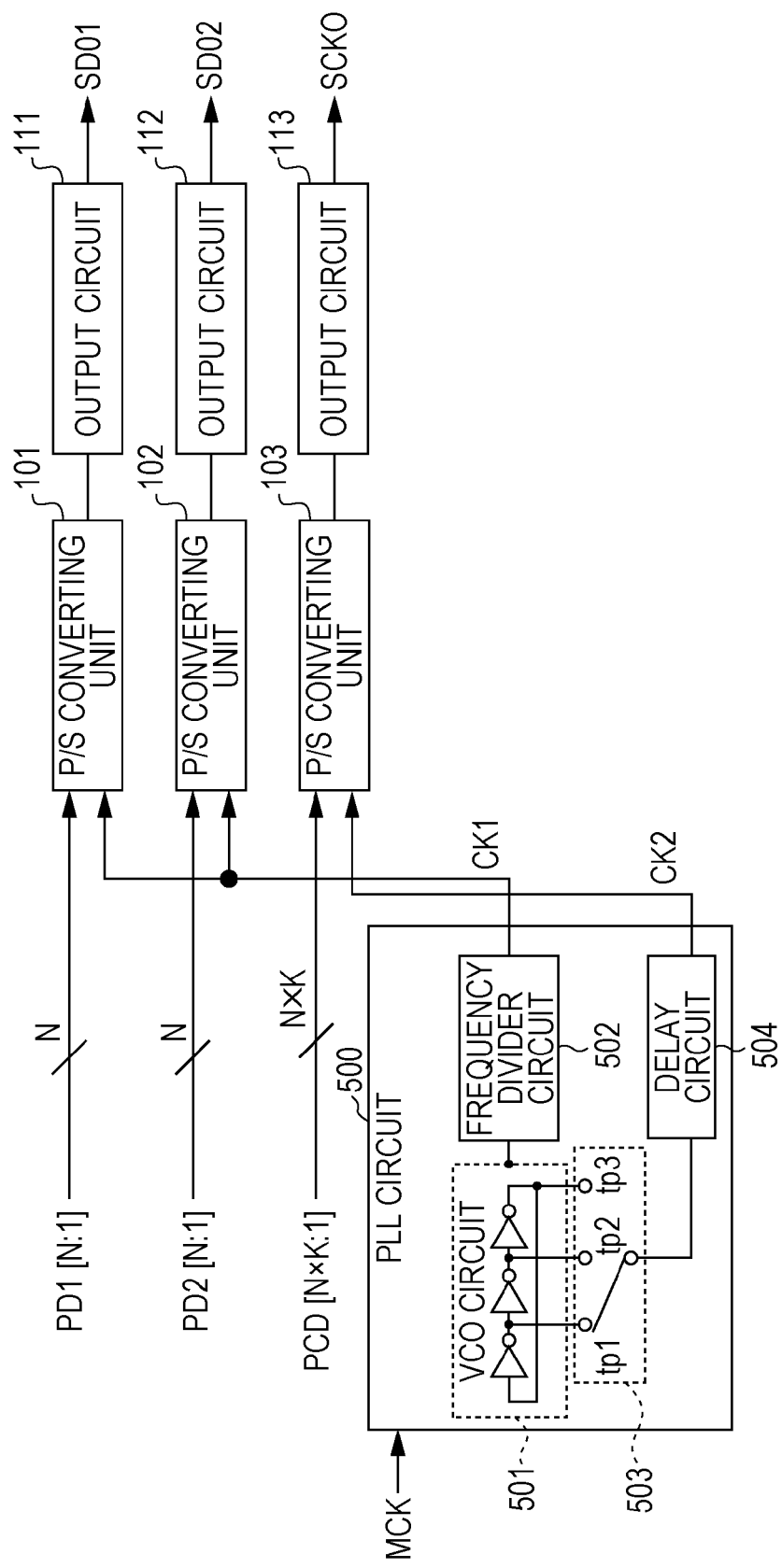
FIG. 5 is a block diagram illustrating another configuration example of a transmitting apparatus according to the present invention.

FIG. 5 is a block diagram illustrating a configuration example of a transmitting apparatus 5 according to this embodiment. The same numerals and signs refer to the same components to those in the transmitting apparatus 1 in FIG. 1. The transmitting apparatus 5 is different from the transmitting apparatus 1 in that it can change the phase relationship between the first and second transfer clocks CK1 and CK2.

A PLL circuit 500 includes a ring oscillator VCO (voltage controlled oscillator) circuit 501 which is a first oscillating unit, a frequency divider circuit 502 which is a frequency dividing unit, a phase selecting circuit 503 which is a phase adjusting unit, and a delay circuit 504 which is a delay unit. The VCO circuit 501 has three inverters connected in a ring-shaped manner, and the frequency of an output signal of the VCO circuit 501 is controlled by controlling the drive current of the inverters with a voltage signal. The VCO circuit 501 is configured to oscillate on the basis of a reference clock MCK input to the PLL circuit 500 and outputs a first intermediate clock acquired by multiplying the reference clock MCK by N×K. The frequency divider circuit 502 generates a frequency-divided clock with a frequency 1/K times of the signal output from the VCO circuit 501. Here, the frequency-divided clock is given to the P/S converting units 101 and 102 as a first converted clock CK1. The phase selecting circuit 503 selects one of outputs tp1, tp2, and tp3 of the inverter circuits included in the ring oscillator in accordance with the control signal supplied from a control unit, not shown, and inputs it to the delay circuit 504. For the signal given through the phase selecting circuit 503, the delay circuit 504 generates a delay clock to which a delay equal to the delay that occurs in the frequency divider circuit 502. Here, the delay clock is output as the second converted clock CK2.

Figure 6:
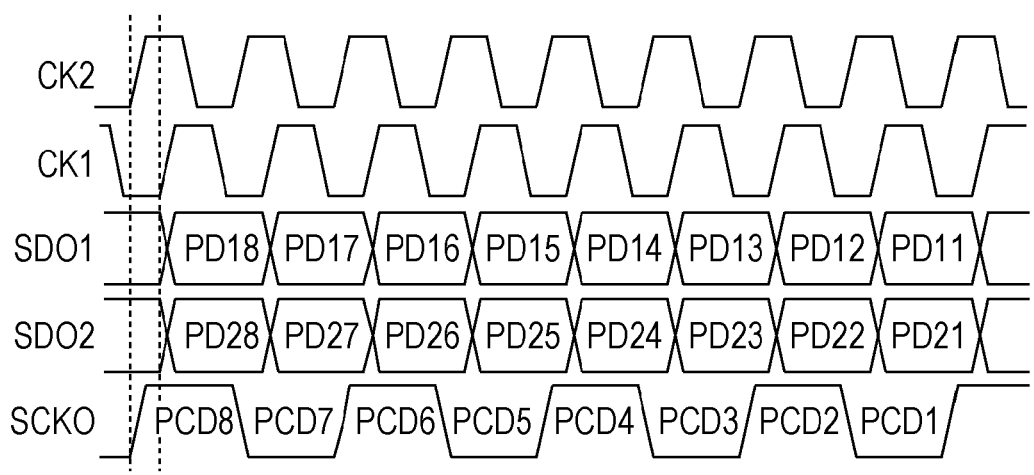
FIG. 6 is a timing chart according to a third embodiment.

FIG. 6 is a timing chart illustrating the relationship between the first and second converted clocks CK1 and CK2 and the serial data signals SDO1 and SDO2 and SCKO where N=8 and K=1 and the phase selecting circuit 503 selects the tp1. Referring to FIG. 6, the parallel clock data signal PCD [(N×K):1] input to the P/S converting unit 103 is [H, L, H, L, H, L, H, L] from the higher order bits, and the P/S converting unit 103 outputs it from the higher order bits. According to this embodiment, the first and second converted clocks CK1 and CK2 are acquired by multiplying the reference clock MCK by 8 and have phases with a difference of ⅓ period.

As illustrated in FIG. 6, since the serial data signals SDO1 and SDO2 and the transfer clock SCKO are in synchronism with the first converted clock CK1 and second converted clock CK2, respectively, the serial data signals SDO1 and SDO2 and the transfer clock SCKO have different phases from each other.

In this manner, by differentiating the phases of the serial data signals SDO1 and SDO2 and the transfer clock SCKO, further simplification of the configuration of a receiving side apparatus can be realized. The reasons will be described below.

Figure 7:
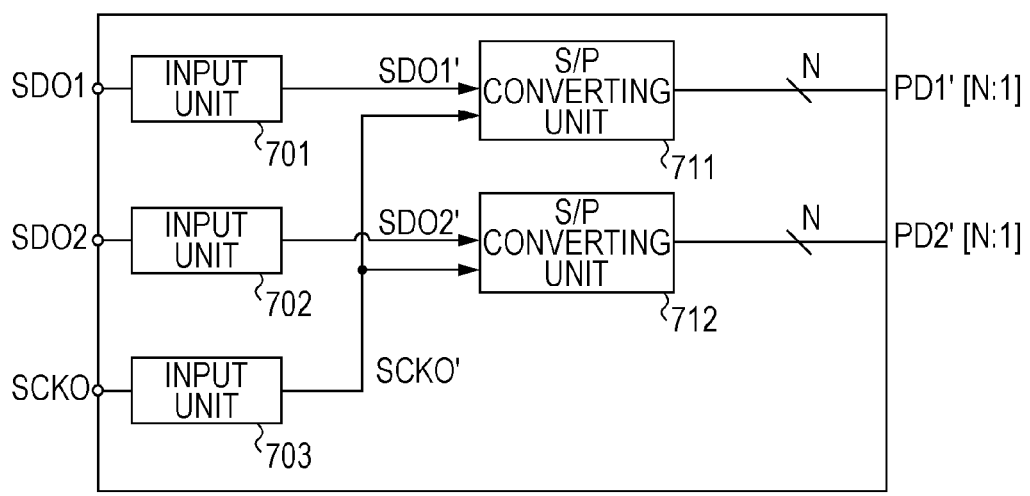
FIG. 7 is a block diagram illustrating another configuration example of a receiving side apparatus according to the present invention.
Figure 8:
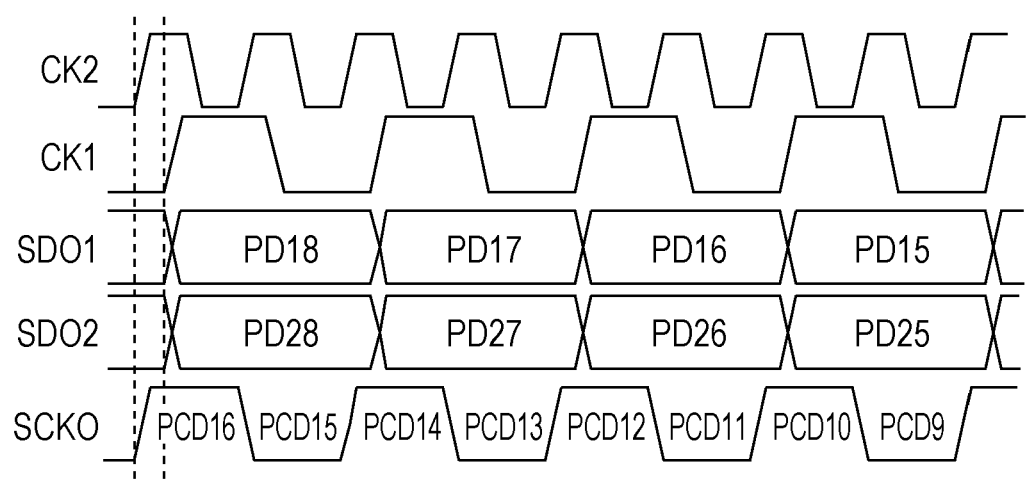
FIG. 8 is another timing chart according to the third embodiment.

FIG. 7 illustrates a configuration example of a receiving side apparatus (receiving apparatus). A receiving side apparatus 7 includes input units 701 to 703 which receive and output serial data signals SDO1 and SDO2 and a transfer clock SCKO and serial/parallel converting units (S/P converting units) 711 and 712.

The input units 701 to 703 may include a buffer, for example.

The S/P converting unit 711 receive a serial data signal SDO1' and a transfer clock SCKO' from the input unit 701 and converts the serial data signal SDO1' to a parallel data signal PD1' [N:1] which is a third parallel data signal in synchronism with the transfer clock.

The S/P converting unit 712 receives a serial data signal SDO2' and a transfer clock SCKO' from the input unit 702 and converts the serial data signal SDO2' to a parallel data signal PD2' [N:1] which is a third parallel data signal in synchronism with the transfer clock.

As already described, the serial data signals SDO1 and SDO2 and transfer clock SCKO have different phases from each other. Thus, the serial data signals SDO1' and SDO2' and transfer clock SCKO' output from the input units 701 to 703 having an equivalent circuit configuration have different phases from each other. Therefore, even when the S/P converting units 711 and 712 latch the serial data signals SDO1' and SDO2' in synchronism with the rising or falling edge of the transfer clock SCKO', a sufficient setup time can be provided. In other words, as illustrated in FIG. 3, a receiving side apparatus is not required to include a PLL circuit, so the receiving side apparatus may have a simpler circuit configuration with highly accurate communication.

Having described the case where K=1, K is not limited thereto. For example, the case where N=8 and K=2 and a parallel clock data signal PCD [(8×2):1] have [H, L, H, L, . . . , H, L] from the higher bit in which H and L alternate with each other will be described with reference to FIG. 8. The phase selecting circuit 503 here is controlled so as to connect the tp1 to the delay circuit 504.

A first converted clock CK1 acquired by multiplying a reference clock MCK input to the PLL circuit 500 by 8 and a second converted clock CK2 acquired by multiplying the reference clock MCK by 8×2=16 are output from the PLL circuit 500. In other words, the VCO circuit 501 oscillates 16 times of the reference clock MCK, and the frequency is divided into half by the frequency divider circuit 502.

The parallel data signal PD1 [N:1] is serial converted by the P/S converting unit 101 in synchronism with the first converted clock CK1 and is output as a serial data signal SDO1 from the output circuit 111.

In the same manner, the parallel data signal PD2 [N:1] is serial converted by the P/S converting unit 102 in synchronism with the first converted clock CK1 and is output as a serial data signal SDO2 from the output circuit 112.

The parallel clock data signal PCD [(N×K):1] is serial converted by the P/S converting unit 103 in synchronism with the second converted clock CK2 and is output as a transfer clock SCKO from the output circuit 113.

Since the phase selecting circuit 503 selects the tp1, the second converted clock CK2 has a phase displaced from the first converted clock CK1 by 1/(N×K×3)=⅛ period of the reference clock MCK. The serial data signals SDO1 and SDO2 and transfer clock SCKO are in synchronism with different converted clocks. Thus, the serial data signals SDO1 and SDO2 have the same data rate as that of the frequency of the transfer clock SCKO, and the phases of them are different by ⅛ period of the reference clock MCK.

Also in this case, in the receiving side apparatus, the serial data signals SDO1 and SDO2 as illustrated in FIG. 7 are converted to parallel data signals by the S/P converting units which operate in synchronism with the rising or falling edge of the transfer clock SCKO. Since the rising or falling edge of the transfer clock SCKO can be used, the receiving side apparatus is not required to have a PLL circuit and may thus have a simpler configuration. The simpler configuration can provide many advantages including not only easy design thereof but also reduction of the number of components and thus can reduce the costs.

The VCO circuit 501 is not limited to that illustrated. Increasing the number of stages of the ring oscillator allow fine adjustment of the phase difference between the first and second converted clocks.

Having described that the outputs from the inverters of the ring oscillator are given as they are to the delay circuit 504 in the transmitting apparatus illustrated in FIG. 5, the outputs may be inverted by an inverter circuit, for example. Thus, the phase relationship between the first and second converted clocks can further be adjusted. The inverter circuit may be provided for each stage of the ring oscillator or may be provided after the phase selecting circuit.

As described above, according to this embodiment, a highly accurate communication can be implemented with a simpler configuration, and a receiving side apparatus can also be designed more easily.

Others

Having described up to this point the case with the parallel data signals PD1 and PD2, for example, the number of parallel data signals is not limited thereto. The number of parallel data signals may be one or three or more. In any cases, the effect of the present invention of reduction of the skew can be provided.

Having described according to the aforementioned embodiments that the parallel clock data signal PCD is the K times bit count of the parallel data signal PD1 or PD2, the bit count of the parallel data signal PD1 or PD2 may be set to the K times bit count of the parallel clock data signal PCD.

The parallel clock data signal PCD may be N bits while the parallel data signals PD1 and PD2 may be (N×K) bits. Furthermore, K bits of the data of the parallel data signals PD1 and PD2 may be handled as one unit. Thus, even when the first and second converted clocks CK1 and CK2 have the same frequency, the data rate of the serial data signals SDO1 and SDO2 may be 1/K times of the transfer clock SCKO.

The aforementioned embodiments include a PLL circuit which can output the first and second converted clocks CK1 and CK2, for example. However, when K=1, the CK1 and CK2 may not typically be separate outputs and may be unified to either one. This can further simplify the configuration of the transmitting apparatus.

The output units may be differential output circuits which output differential signals such as an LVDS driver, instead of buffers. The LVDS driver may be generally known one which outputs a low voltage differential signal. In this case, the input units in a receiving side apparatus may be configured to receive differential signals.

As described above, according to the present invention, the skew between a transfer clock and a serial data signal can be reduced, and a highly accurate communication can be achieved with a simple configuration. A receiving side apparatus may be designed easily. In other words, in a communication system including the transmitting apparatus and receiving apparatus as described above, the skew can be reduced. Thus, the communication system can achieve communication with high accuracy and can further be designed easily.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-297376 filed Dec. 28, 2009, which is hereby incorporated by reference herein in its entirety.

What is claimed is:

1. A communication system comprising:
a transmitting apparatus including
a clock generating unit configured to generate a first converted clock by multiplying a reference clock input thereto by N (where N is a natural number greater than 2) and a second converted clock by multiplying the reference clock by N×K (where K is a natural number);
a first parallel/serial converting unit configured to convert an N-bit first parallel data signal input thereto to a first serial data signal in synchronism with the first converted clock; and
a second parallel/serial converting unit configured to convert an (N×K)-bit second parallel data signal input thereto to a second serial data signal in synchronism with the second converted clock, and
a receiving apparatus configured to convert the first serial data signal output from the transmitting apparatus to a third parallel data signal on the basis of the second serial data signal.

2. The communication system according to claim 1, wherein the receiving apparatus has a serial/parallel converting unit configured to convert the first serial data signal to the third parallel data signal in synchronism with the second serial data signal.

3. The communication system according to claim 1, wherein the receiving apparatus has a second oscillating unit configured to oscillate on the basis of the second serial data signal and outputs a second intermediate clock, and
a serial/parallel converting unit configured to convert the first serial data signal to the third parallel data signal in synchronism with the second intermediate clock.

4. A communication system comprising:
a transmitting apparatus comprising:
a clock generating unit configured to generate a first converted clock by multiplying a reference clock input thereto by N×K (where N and K are natural numbers and N is greater than 2) and a second converted clock by multiplying the reference clock by N;
a first parallel/serial converting unit configured to convert an (N×K)-bit first parallel data signal input thereto to a first serial data signal in synchronism with the first converted clock; and
a second parallel/serial converting unit configured to convert an N-bit second parallel data signal input thereto to a second serial data signal in synchronism with the second converted clock, and a receiving apparatus configured to convert the first serial data signal output from the transmitting apparatus to a third parallel data signal on the basis of the second serial data signal.

5. The communication system according to claim 4, wherein the receiving apparatus has a serial/parallel converting unit configured to convert the first serial data signal to the third parallel data signal in synchronism with the second serial data signal.

6. The communication system according to claim 4, wherein the receiving apparatus has a second oscillating unit configured to oscillate on the basis of the second serial data signal and outputs a second intermediate clock, and
a serial/parallel converting unit configured to convert the first serial data signal to the third parallel data signal in synchronism with the second intermediate clock.

7. A transmitting apparatus for a communication system in which a first serial data signal is converted to a third parallel data signal on the basis of a second serial data signal, the transmitting apparatus comprising:
a clock generating unit configured to generate a first converted clock by multiplying a reference clock input thereto by N (where N is a natural number greater than 2) and a second converted clock by multiplying the reference clock by N×K (where K is a natural number);
a first parallel/serial converting unit configured to convert an N-bit first parallel data signal input thereto to the first serial data signal in synchronism with the first converted clock; and
a second parallel/serial converting unit configured to convert an (N×K)-bit second parallel data signal input thereto to the second serial data signal in synchronism with the second converted clock.

8. The transmitting apparatus according to claim 7, further comprising a parallel data setting unit configured to set the second parallel data signal variably.

9. The transmitting apparatus according to claim 7, wherein the clock generating unit comprises:
a first oscillating unit configured to oscillate on the basis of the reference clock and outputs a first intermediate clock; and
a frequency dividing unit configured to divide the first intermediate clock to generate a frequency-divided clock,
wherein the first intermediate clock or the frequency-divided clock is handled as the first or second converted clock.

10. The transmitting apparatus according to claim 9, further comprising:
a delay unit configured to delay the first intermediate clock, wherein the clock delayed by the delay unit is handled as the second converted clock.

11. The transmitting apparatus according to claim 7, further comprising:
a phase adjusting unit configured to set a phase difference between the first converted clock and the second converted clock.

12. The transmitting apparatus according to claim 7, wherein the first and second converted clocks are matched in phase and frequency.

13. The transmitting apparatus according to claim 12, wherein the first and second converted clocks are the same signal generated by the clock generating unit.

14. The transmitting apparatus according to claim 7, further comprising:
an output unit configured to output the first and second serial data signals,
wherein the output unit is a buffer or a differential output circuit configured to output a differential signal.

15. The transmitting apparatus according to claim 14, wherein the differential output circuit is an LVDS driver configured to output a low voltage differential signal.

16. A transmitting apparatus for a communication system in which a first serial data signal is converted to a third parallel data signal on the basis of a second serial data signal, the transmitting apparatus comprising:
a clock generating unit configured to generate a first converted clock by multiplying a reference clock input thereto by N×K (where N and K are natural numbers and N is greater than 2) and a second converted clock by multiplying the reference clock by N;
a first parallel/serial converting unit configured to convert an (N×K)-bit first parallel data signal input thereto to the first serial data signal in synchronism with the first converted clock; and
a second parallel/serial converting unit configured to convert an N-bit second parallel data signal input thereto to the second serial data signal in synchronism with the second converted clock.

17. The transmitting apparatus according to claim 16, further comprising a parallel data setting unit configured to set the second parallel data signal variably.

18. The transmitting apparatus according to claim 16 wherein the clock generating unit comprises:
a first oscillating unit configured to oscillate on the basis of the reference clock and outputs a first intermediate clock; and
a frequency dividing unit configured to divide the first intermediate clock to generate a frequency-divided clock,
wherein the first intermediate clock or the frequency-divided clock is handled as the first or second converted clock.

19. The transmitting apparatus according to claim 18, further comprising:
a delay unit configured to delay the first intermediate clock, wherein the clock delayed by the delay unit is handled as the second converted clock.

20. The transmitting apparatus according to claim 16, further comprising
a phase adjusting unit configured to set a phase difference between the first converted clock and the second converted clock.

21. The transmitting apparatus according to claim 16, wherein the first and second converted clocks are matched in phase and frequency.

22. The transmitting apparatus according to claim 21, wherein the first and second converted clocks are the same signal generated by the clock generating unit.

23. The transmitting apparatus according to claim 16, further comprising an output unit configured to output the first and second serial data signals, wherein the output unit is a buffer or a differential output circuit configured to output a differential signal.

24. The transmitting apparatus according to claim 23, wherein the differential output circuit is an LVDS driver configured to output a low voltage differential signal.

* * * * *